(12) United States Patent  
Colinet et al.

(10) Patent No.: US 8,487,676 B2
(45) Date of Patent: Jul. 16, 2013

(54) DEVICE FOR GENERATING CLOCK SIGNALS FOR ASYMMETRIC COMPARISON OF PHASE ERRORS

(75) Inventors: Eric Colinet, Bois Guillaume (FR); Dimitri Galayko, Paris (FR); Anton Korniienko, Lyons (FR)

(73) Assignees: Commissariat a l'Energie Atomique et Aux Energies Alternatives, Paris (FR); Centre National de la Recherche Scientifique, Paris (FR); Universite Pierre et Marie Curie (Paris 6), Paris (FR)

( * ) Notice: Subject to any disclaimer, the term of this patent is extended or adjusted under 35 U.S.C. 154(b) by 0 days.

(21) Appl. No.: 13/503,738

(22) PCT Filed: Oct. 28, 2010

(86) PCT No.: PCT/EP2010/066405
§ 371 (c)(1),
(2), (4) Date: Apr. 24, 2012

(87) PCT Pub. No.: WO2011/051407
PCT Pub. Date: May 5, 2011

(65) Prior Publication Data
US 2012/0206177 A1   Aug. 16, 2012

(30) Foreign Application Priority Data
Oct. 29, 2009   (FR) ...................................... 09 57638

(51) Int. Cl.
*H03L 7/06* (2006.01)
(52) U.S. Cl.
USPC ......................................... 327/156; 327/147

(58) Field of Classification Search
None
See application file for complete search history.

(56) References Cited

U.S. PATENT DOCUMENTS

| 3,504,125 A | 3/1970 | Hiroshi Inose et al. |
| 3,555,194 A * | 1/1971 | Goto .............................. 370/507 |
| 3,597,552 A | 8/1971 | Goto |
| 3,920,915 A | 11/1975 | Schlichte |

(Continued)

FOREIGN PATENT DOCUMENTS

WO   WO 92/13305 A1   8/1992

OTHER PUBLICATIONS

François Anceau, "Une technique de reduction de la puissance dissipée par l'horlogerie des circuits complexes rapides", Laboratoire PICM, 5 pages (previously submitted on Aug. 20, 2012; submitting English-language translation of Abstract only).

(Continued)

*Primary Examiner* — Cassandra Cox
(74) *Attorney, Agent, or Firm* — Oblon, Spivak, McClelland, Maier & Neustadt, L.L.P.

(57) ABSTRACT

A device for generating a clock signal, including a phase-locked loop including: a controlled oscillator to deliver a clock signal; plural phase comparators to compare a phase of the clock signal delivered by the controlled oscillator with plural clock signal phases applied at an input of the phase-locked loop; a mechanism for weighted summation of output signals of the plural phase comparators such that one or more of the weighting coefficients applied to one of the output signals has an absolute value that overrides the absolute values of the other weighting coefficients applied to the other output signals; and a mechanism filtering the weighted sum of the output signals of the plural phase comparators, to deliver at an output a control signal to the controlled oscillator.

12 Claims, 9 Drawing Sheets

U.S. PATENT DOCUMENTS

Figure 1:
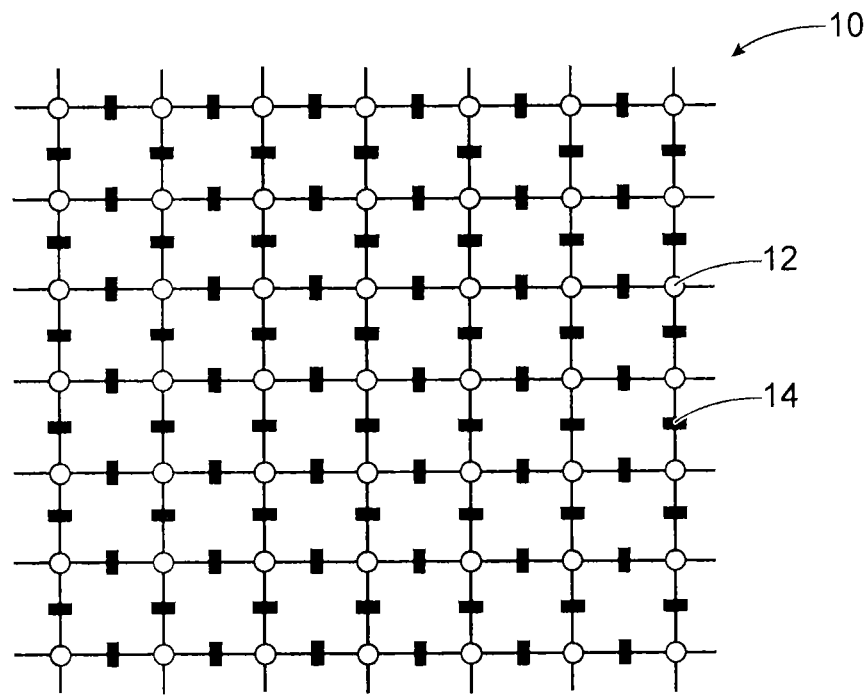

| | | | |
|---|---|---|---|
| 5,228,138 | A | 7/1993 | Pratt et al. |
| 6,538,516 | B2 * | 3/2003 | Lenk .................................. 331/2 |
| 6,633,621 | B1 | 10/2003 | Bishop et al. |
| 7,394,323 | B2 * | 7/2008 | Sasaki ............................. 331/16 |
| 7,680,235 | B2 * | 3/2010 | Sano et al. ..................... 375/376 |
| 2004/0100333 | A1 * | 5/2004 | Mizuno et al. .................. 331/46 |
| 2005/0141662 | A1 | 6/2005 | Sano et al. |
| 2007/0011482 | A1 * | 1/2007 | Sai et al. ........................ 713/500 |

OTHER PUBLICATIONS

International Search Report Issued Jan. 3, 2011 in PCT/EP2010/066405.

French Search Report Issued Aug. 30, 2010 in Patent Application No. FR 0957638 (with English Translation of Category of cited Documents).

A. Korniienko et al., "H∞ loop shaping control for distributed PLL network", Research in Microelectronics and Electronics, Jul. 12, 2009, pp. 336-339.

Vadim Gutnik et al., "Active GHz Clock Network Using Distributed PLLs", IEEE Journal of Solid-State Circuits, vol. 35, No. 11, Nov. 2000, pp. 1553-1560.

José A. Tierno et al., "A Wide Power Supply Range, Wide Tuning Range, All Static CMOS All Digital PLL in 65 nm SOI", IEEE Journal of Solid-State Circuits, vol. 43, No. 1, Jan. 2008, pp. 42-51.

E. Zianbetov et al., "Design and VHDL Modeling of All-Digital PLLs", $8^{th}$ IEEE International NEWCAS Conference, Jun. 2010, pp. 293-296.

Peter M. Levine et al., "A High-Resolution Flash Time-To-Digital Converter and Calibration Scheme", ITC International Test Conference, Oct. 2004, pp. 1148-1157.

François Anceau, "Une technique de réduction de la puissance dissipée par l'horlogerie des circuits complexes rapides", Laboratoire PICM, 5 pages.

Eby G. Friedman, "Clock Distribution Networks in Synchronous Digital Integrated Circuits", Proceedings of the IEEE, vol. 89, No. 5, May 2001, pp. 665-692.

Martin Saint-Laurent et al., "A Multi-PLL Clock Distribution Architecture for Gigascale Integration", IEEE, 2001, pp. 30-35.

Tadao Saito, "Application of Phase-Locked Oscillator for PCM Network Synchronization", IEEE Transactions on Communications, vol. 30, No. 10, Oct. 1982, pp. 2344-2354.

Gill A. Pratt et al., "Distributed Synchronous Clocking", IEEE Transactions on Parallel and Distributed Systems, vol. 6, No. 3, Mar. 1995, pp. 314-328.

Dimitri Galayko, "Operation and on Simulink model implementation of a digital N-bit phase/frequency detector", Apr. 21, 2009, 14 pages.

* cited by examiner

DEVICE FOR GENERATING CLOCK SIGNALS FOR ASYMMETRIC COMPARISON OF PHASE ERRORS

TECHNICAL FIELD

The invention concerns the field of generation and synchronisation of distributed clock signals, used for example for the synchronisation of one or more devices such as microprocessors, and/or in the telecommunications field.

STATE OF THE PRIOR ART

In a synchronous digital system a clock signal enables a time reference to be defined, notably used for the propagation of data in the system and for the sequencing of the various elements of the system. A synchronous system on a chip, for example a microprocessor, generally includes a clock distribution tree enabling the clock signals to be distributed from a source to the sequential elements of the system to be sequenced. Synchronisation of the generated clocks is obtained by equalizing the periods of propagation of the clock signal originating from the source in each branch of the distribution system.

In the case of multiprocessor system circuits it is very complicated, and sometimes impossible, to produce a perfectly balanced clock distribution tree. This balancing is often imprecise, and the clock signals may become desynchronised in these circuits. In addition, when a new element is added to the system, for example an additional microprocessor, this can require that the entire clock distribution tree is redimensioned. Finally, a fault in one of the branches of the clock distribution tree can easily affect a large portion of the parallel system, depending on the position of the fault.

In addition, even when the clock distribution tree is well designed and balanced, having all the correct branch lengths without any fault, there are always substantial sources of imperfections of the "skew" type (phase-shifting relative to the clock's nominal value) and "jitter" type (oscillations around the clock's nominal value), which are notably related to the use of buffers in the clock signal distribution tree, which act as repeaters of the clock signal, and to crosstalk between the lines. These imperfections are particularly critical for high-frequency clock signals. In addition, due to the increase of clock signal frequencies, it can happen that the clock "skew" through the chip is comparable to the clock cycle, inevitably causing computation errors. Finally, the use of a high clock frequency implies high power consumption (partly dissipated in the form of heat). This excess consumption is caused notably by the high parasitic impedance of the wide distribution branches required in a clock signal distribution tree.

As an alternative to the traditional clock signal distribution tree, it is possible to use a distributed network of PLLs (phase-locked loops, or phase servo loops) with multiple inputs, interconnected, or coupled, to one another, where each PLL generates a local clock signal synchronised actively with the other PLLs. A PLL generally consists of one or more phase comparators (also called phase detectors), of a VCO (voltage-controlled oscillator) and of an equalizer controlling the VCO in order to become synchronised relative to a reference clock signal. It is said that a set of oscillators is synchronised in terms of phase and frequency when each of the oscillators is oscillating at the same frequency with the same phase. The synchronisation is qualified as active when the measurement and compensation of the phase-shift occur in real time, enabling the problems relating to the influence of all the possible disturbances (temperature, parasitic impedance, dispersion, ageing, fault) to be remedied at each instant.

An example of such a distributed network 10 of PLLs is represented in FIG. 1. This network 10 has nodes 12, where each node 12 includes a VCO, an adder and an equalizer giving the VCO the control regulating the frequency of the VCO. One or more nodes 12 of distributed network 10 are not formed by a VCO and its associated equalizer, but by one or more synchronous oscillating sources forming a master clock with which the oscillators formed by the other nodes of distributed network 10 will be synchronised. Nodes 12 form clock generators which are spatially separated from one another and connected to one another in the form of a regular two-dimensional grid. Phase comparators 14 positioned between nodes 12 provide the phase error of a VCO relative to the adjacent VCO. Each VCO of nodes 12 forms, with the phase comparators 14 adjacent to it, a PLL. The phase errors originating from the nodes adjacent to each of nodes 12 are added together and filtered within this node, and are used to adjust the phase of the VCO of this node, in order to make it equal to the average phase of the adjacent nodes. Thus, when each node is synchronised with the average phase of its adjacent nodes, the entire distributed network 10 is said to be globally synchronised in terms of frequency and phase. The synchronous local clocks formed within each node 12 can then be distributed easily using traditional methods which are simple given the small size of the local zones, thus resolving the problems encountered with clock signal distribution trees.

In this architecture, instead of using wide distribution branches, only simple lines are used, enabling adjacent nodes to be interconnected, by this means compensating systematically for the propagation times. In addition, by using frequency dividers within each node, the clock signal may be distributed at low frequency, whilst retaining high local frequencies (within the nodes).

Such PLL distributed network architecture however has a major flaw. Indeed, due to the cyclic nature of the phase (for example: $\pi/2 = -3\pi/2 = 5\pi/2$), it is possible that network 10 becomes stabilised in modes in which there is indeed a zero average phase error in each node of the network (average of the phase errors delivered by the comparators of phases adjacent to each node), but in which several clocks are not phase-synchronised. These modes, called parasitic or "mode-locking" modes, are stable equilibrium points characterised by an equal frequency in each node with constant phase shifts. Such a parasitic mode is illustrated for a network of 2×2 interconnected nodes represented in FIG. 2. The oscillation frequencies of the VCOs of the 4 nodes 12.1-12.4 are identical. At an instant t the phase in node 12.1 is equal to 0, that in node 12.2 is equal to $\pi/2$, that in node 12.3 is equal to $-\pi/2$ and that in node 12.4 is equal to $\pi$. In this configuration, for each of nodes 12.1-12.4 the phase error of an adjacent node is precisely cancelled by the phase error of the other adjacent node (since the phase errors are sent between nodes 12.1-12.4 by phase comparators 14.1-14.4, where each comparator operates in a bidirectional manner for the two nodes adjacent to it). The total phase error for four nodes 12.1-12.4 is therefore zero despite the inequality of the phases between each node in the network. Such a network is therefore maintained in a stable parasitic mode (mode-locking state).

Document WO 92/13305 describes a solution to resolve the problem of parasitic modes in a distributed oscillators network. The solution consists in using particular phase comparators. It is notably demonstrated in this document that when such a network is stabilised in a parasitic node, at least one of the phase comparators measures a phase shift $\Delta\phi \leq \pi/2$. It is therefore proposed to produce phase comparators having a particular static response notably comprising a negative gradient when $\Delta\phi \geq \pi/2$, making the network unstable when it is in a parasitic mode.

However, implementation of such phase comparators is very delicate and causes problems when it is desired to guarantee with certainty that the clock distribution system will be stable under different operating conditions (voltage, temperature, noise). In addition, practical production of these phase comparators uses only analog components, which in fact aggravates the problems mentioned above. The current chip-based systems are disturbed by many sources of electrical noise which can affect control signals. The correcting filter associated with each node in the network must therefore eliminate noise sufficiently, whilst limiting the area of silicon required for its deployment for cost-related reasons. These constraints make analysis of the clock distribution system's stability even more difficult.

ACCOUNT OF THE INVENTION

One aim of the present invention is to provide a device for generating at least one clock signal preventing parasitic modes (mode-locking), i.e. reducing the risk that the device becomes stabilised in a parasitic mode, which does not imply a complex implementation of phase comparators.

A device for generating at least one clock signal is proposed, including at least one phase-locked loop including:
- a controlled oscillator capable of delivering the clock signal at output,
- a plurality of phase comparators capable of comparing a phase of the clock signal delivered by the controlled oscillator with a plurality of clock signal phases applied at input of the phase-locked loop,
- means for weighted summation of output signals of the plurality of phase comparators such that at least one of the weighting coefficients applied to one of said output signals has an absolute value higher than the absolute values of the other weighting coefficients applied to the other output signals,
- means for filtering the weighted sum of the output signals of the plurality of phase comparators able to deliver at output a control signal to the controlled oscillator.

A device is also proposed for generating at least one clock signal, including a distributed network of phase-locked loops which are interconnected and synchronised with one another, where each phase-locked loop includes:
- a controlled oscillator capable of delivering the clock signal at output,
- a plurality of phase comparators capable of comparing a phase of the clock signal delivered by the controlled oscillator with a plurality of clock signal phases delivered at outputs of the adjacent phase-locked loops, and applied at inputs of the phase-locked loop,
- means for weighted summation of output signals of the plurality of phase comparators such that one of the weighting coefficients applied to one of said output signals has an absolute value higher than the sum of the absolute values of the other weighting coefficients applied to the other output signals and/or such that the sum of the absolute values of the weighting coefficients applied to a part of said output signals is greater than the sum of the absolute values of the other weighting coefficients applied to the other output signals,
- means for filtering the weighted sum of the output signals of the plurality of phase comparators, able to deliver at output a control signal to the controlled oscillator, and in which, when the sum of the absolute values of the weighting coefficients applied to a part of said output signals is greater than the sum of the absolute values of the other weighting coefficients applied to the other output signals, the clock signals, delivered at the outputs of the adjacent phase-locked loops, and the phases of which compared to the phase of the clock signal delivered by the controlled oscillator correspond to said output signals to which are applied the weighting coefficients, the sum of the absolute values of which is greater than the sum of the absolute values of the other weighting coefficients, are propagated in the distributed network of phase-locked loops without forming a closed loop.

By virtue of the weighted summation accomplished between the output signals of the phase comparators, this device therefore makes an asymmetrical comparison between the different phase errors of the clock signals applied at input of the PLL, for example originating from adjacent nodes when this device forms a distributed PLL network. This asymmetrical comparison enables the device to operate in two different modes. Indeed, when the phase of the clock signal generated by the controlled oscillator is remote from the phases of the clock signals applied at the input of the PLL, all the phase differences between the clock signal generated by the controlled oscillator and the clock signals applied at the input of the PLL are taken into account. Conversely, when the phase of the clock signal generated by the controlled oscillator is close to the phases of the clock signals applied at the input of the PLL, for example between the phases of two of these clock signals, the weighting accomplished when the phase errors are summed enables only the phase error weighted by the highest coefficient to be taken into account, and therefore greater importance to be accorded to at least one of the phase errors than to the other phase errors (or, for example, greater importance to be accorded to two of the phase errors than to at least two other phase errors).

The change from one to the other of the operating modes occurs automatically and simply. When the device forms a distributed network of PLLs, this enables the data originating from all the adjacent PLLs to be used when the network is operating in a mode remote from the parasitic modes, and enables them to be avoided by disregarding certain phase errors if the network is too close to these modes.

The device is particularly advantageous when the aim is to generate at least three clock signals, i.e. three interconnected, periodic signals.

The device can notably form a non-linear system with a single stable mode through the elimination of the parasitic modes.

In addition, one notable advantage of such a device, compared to the distributed networks of PLLs of the prior art, is that frequency and phase synchronisation of the clock signals can be accomplished rapidly.

In each phase-locked loop, one of the weighting coefficients applied to one of the output signals may have an absolute value higher than the sum of the absolute values of the other weighting coefficients applied to the other output signals. By this means, resolution of the problems relating to mode-locking is improved, preventing the device from becoming stabilised in a part of these parasitic modes.

It is also possible that the sum of the absolute values of the weighting coefficients applied to a part of said output signals is greater than the sum of the absolute values of the other weighting coefficients applied to the other output signals. These coefficients are then chosen, for all the phase-locked loops in the network, such that the clock signals, delivered at the outputs of the adjacent phase-locked loops, and the phases of which compared to the phase of the clock signal delivered by the controlled oscillator correspond to said output signals to which are applied the weighting coefficients, the sum of the absolute values of which is greater than the sum of the absolute values of the other weighting coefficients, are propagated in the distributed network of phase-locked loops without forming a closed loop, in order to prevent the device becoming stabilised in a parasitic mode.

Each phase-locked loop may include two, three or four phase comparators able to compare a phase of the clock signal delivered by the controlled oscillator with the phases of the clock signals applied at the input of the phase-locked loop. When the device forms a distributed network of PLLs in the form of a two-dimensional grid, the PLL may include two phase comparators when it forms a corner of the network, three phase comparators when the PLL is positioned on an edge of the network, and four phase comparators when the PLL is positioned between the edges of the network.

Each phase comparator may be capable of delivering at output a signal encoded on 1 bit representing the comparison sign which is to be made by the phase comparator between the phase of the clock signal delivered by the controlled oscillator and the phase of one of the clock signals applied at the input of the phase-locked loop.

The use of such phase comparators enables to guarantee that the device is never stabilised in one of the parasitic modes (mode-locking), whatever the device's initial operating conditions.

The phase comparators may be of the bang-bang type. One advantage of such phase comparators is notably that they are simple to implement. However, any type of phase comparator may be used, notably phase comparators having saturation in their output responses.

In a variant, each phase comparator may be capable of delivering at output a signal encoded on several bits representing the sign and the absolute value of the comparison intended to be made by the phase comparator between the phase of the clock signal delivered by the controlled oscillator and the phase of one of the clock signals applied at the input of the phase-locked loop. In this case not only the phase error sign but also its absolute value are encoded.

In this case, the absolute value $n_j$ of said one of the weighting coefficients applied to one of said output signals which is greater than the sum of the absolute values $n_i$ of the other weighting coefficients applied to the other output signals is such that:

$$n_j > \frac{K}{k} \sum_{i \neq j} n_i,$$

where

K: maximum value of the absolute value of the output of one of the phase comparators;

k: minimum value of the absolute value of the output of one of the phase comparators.

In another variant, when the sum of the absolute values $n_j$ of the weighting coefficients applied to a part of said output signals is greater than the sum of the absolute values $n_i$ of the other weighting coefficients applied to the other output signals, the absolute values $n_j$ are such that:

$$\sum n_j > \frac{K}{k} \sum_{i \neq j} n_i,$$

where

K: maximum value of the absolute value of the output of one of the phase comparators;

k: minimum value of the absolute value of the output of one of the phase comparators.

The filtering means may include at least one low-pass filter. Such a low-pass filter notably enables the high-frequency noises of the signal corresponding to the weighted sum of the output signals of the phase comparators to be eliminated and, when the device is of an analog type, i.e. when it includes a PLL made from analog electronic elements, enables high-frequency harmonics of the signal corresponding to the weighted sum of the output signals of the phase comparators to be filtered.

Each of the weighting coefficients of the means of weighted summation may have a value of between −3 and 3.

However, generally, and notably when the distributed network of phase-locked loops forms a two-dimensional network, each of the weighting coefficients of the means of weighted summation may have a value of between −4K/k and 4K/k. In the case in which k=1 and when each phase comparator delivers at output a signal encoded on 1 bit, K=k=1 then applies, and each of the weighting coefficients of the means of weighted summation may have a value of between −4 and 4. The range of values of the weighting coefficients of the means of weighted summation may also be greater than the range of values [−4; 4], for example when the phase comparators deliver at output signals encoded on several bits, and when the maximum value of the absolute output value of one of the phase comparators is greater than 1.

Said absolute value greater than the other absolute values may be greater than the sum of said other absolute values.

The controlled oscillator and/or the phase comparators and/or the means of weighted summation and/or the filtering means may be of the digital type. However, it is also possible that these elements, or more generally the entire clock signal generating device, are produced in analog fashion.

The device may include a plurality of phase-locked loops similar to said phase-locked loop and connected to one another in the form of a grid, where the clock signals applied at the input of the phase-locked loops may be the clock signals delivered at the output of the adjacent phase-locked loops.

The device may also include at least one generator of a reference clock signal applied at the input of at least one of the plurality of phase-locked loops.

The invention also concerns an electronic device including a plurality of electronic elements synchronised by synchronous clock signals delivered by the phase-locked loops of a device as described above. Such an electronic device may be, for example, a microprocessor or a multiprocessor system.

BRIEF DESCRIPTION OF THE ILLUSTRATIONS

Figure 2:
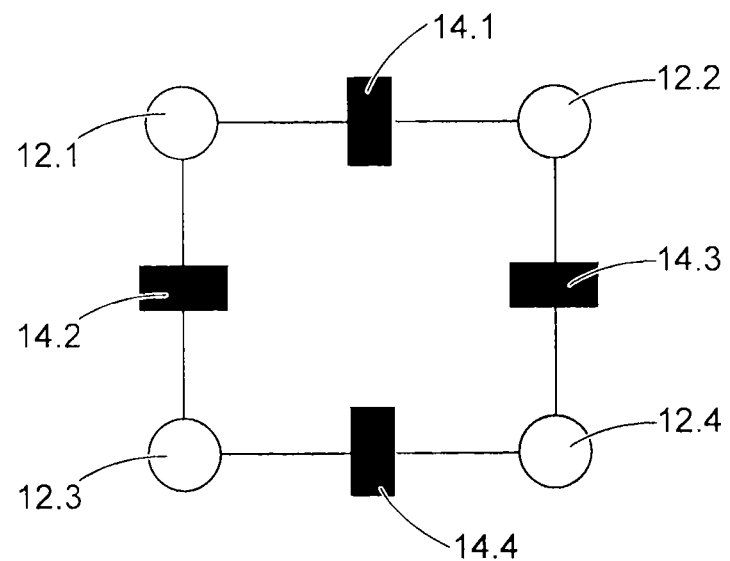
Figure 3:
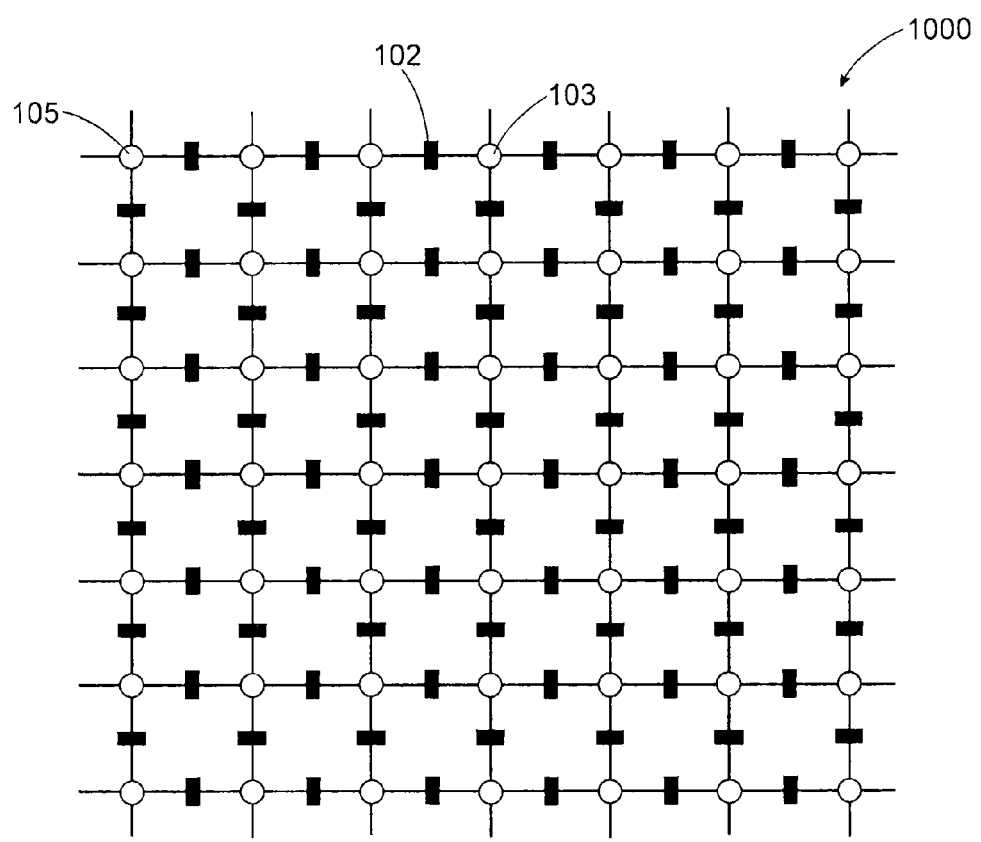
Figure 4:
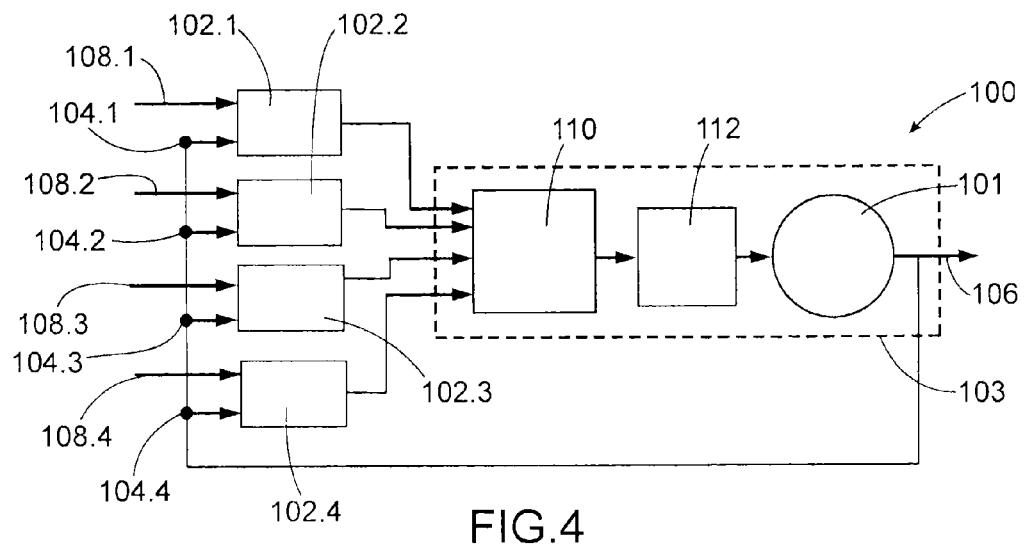
Figure 5:
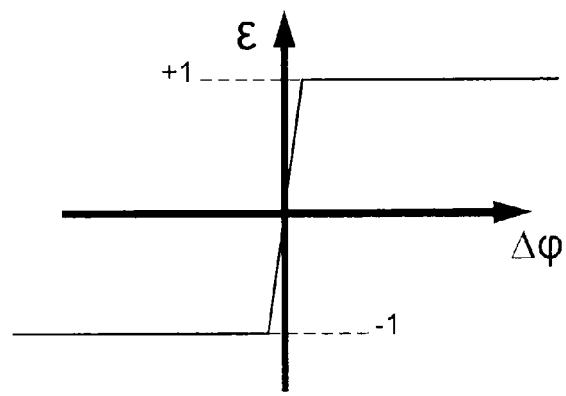
Figure 6:
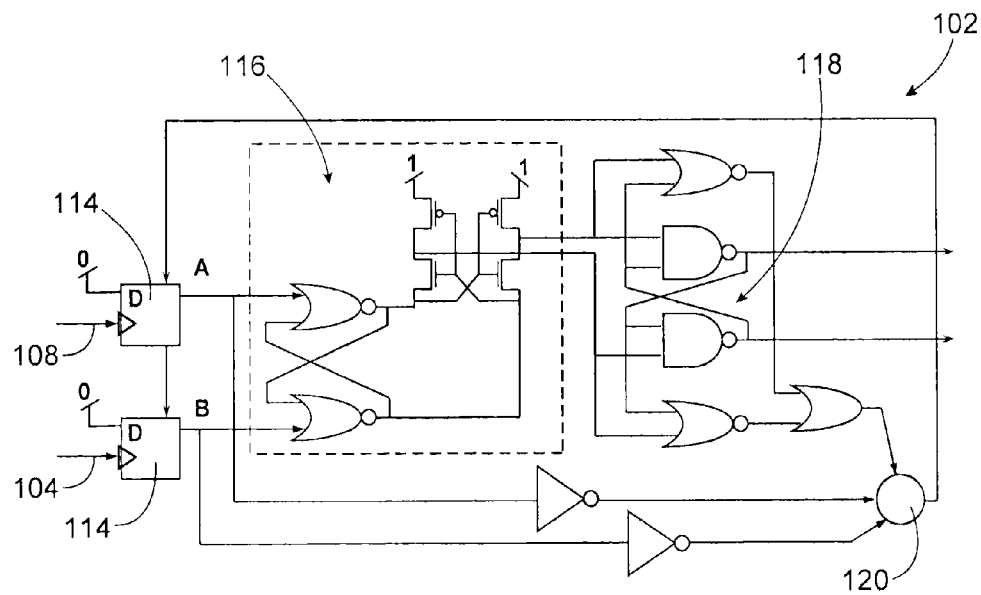
Figure 7:
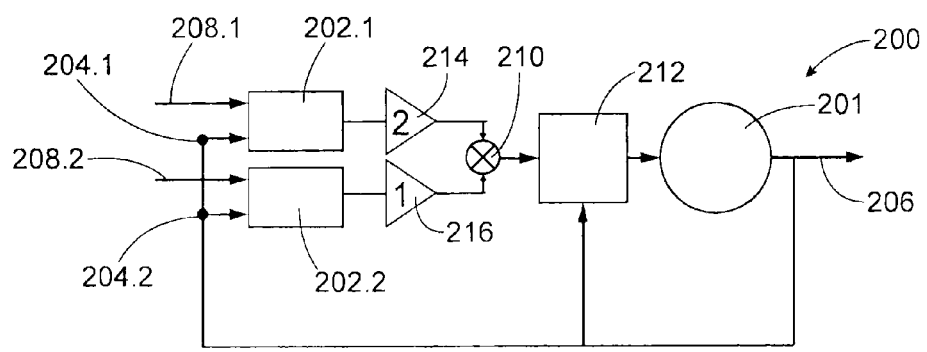
Figure 8:
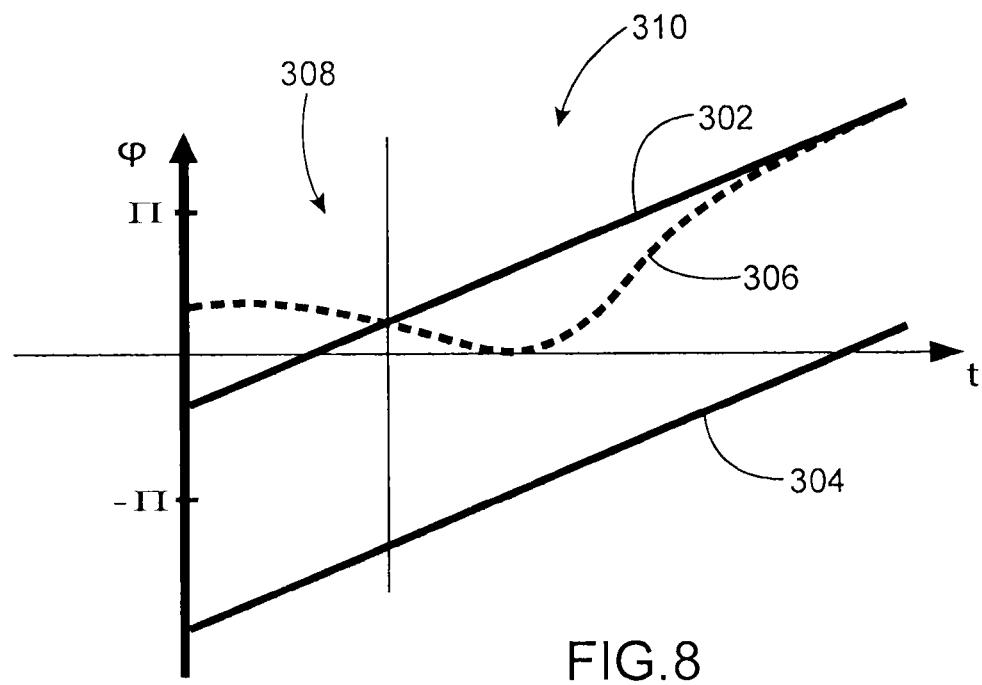
Figure 9:
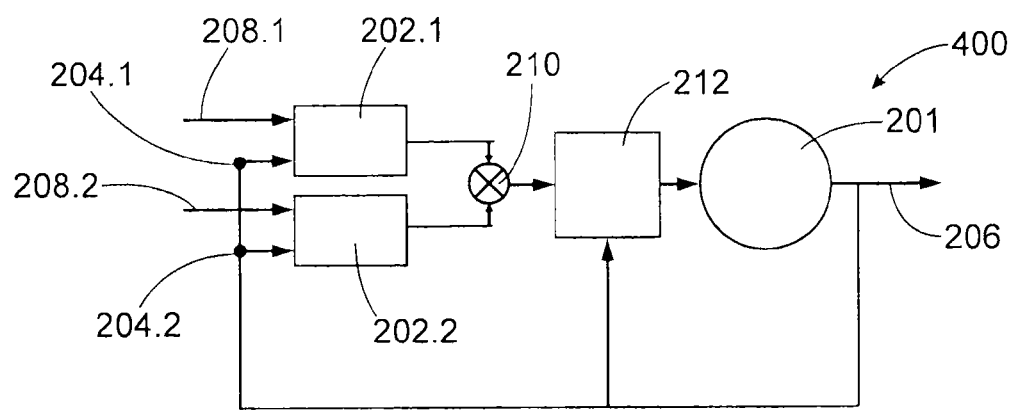
Figure 10:
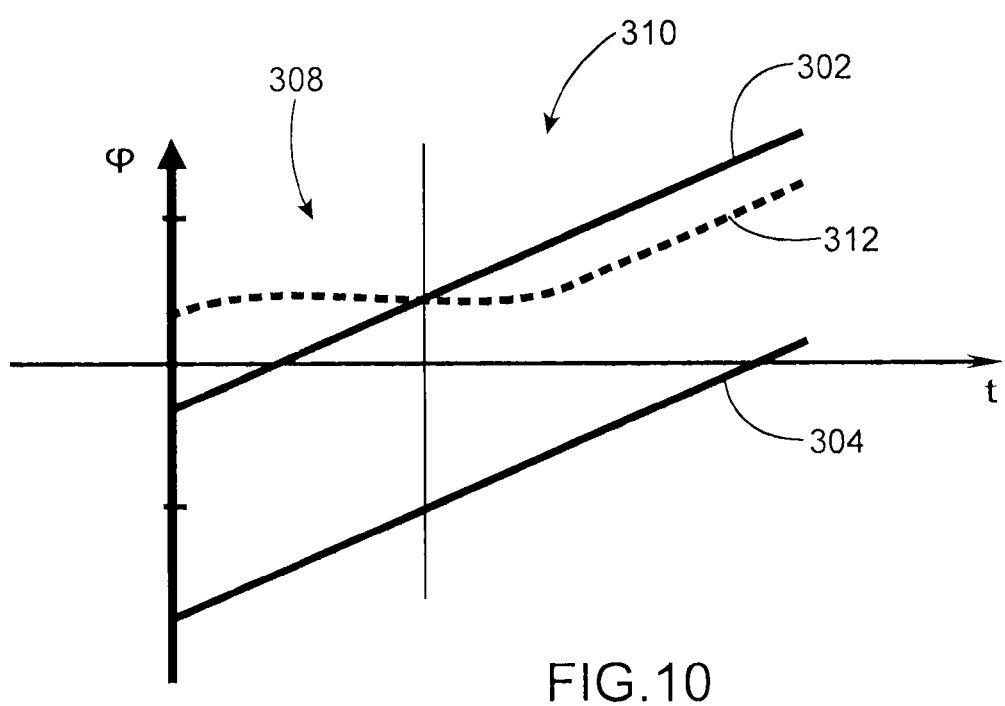
Figure 11A:
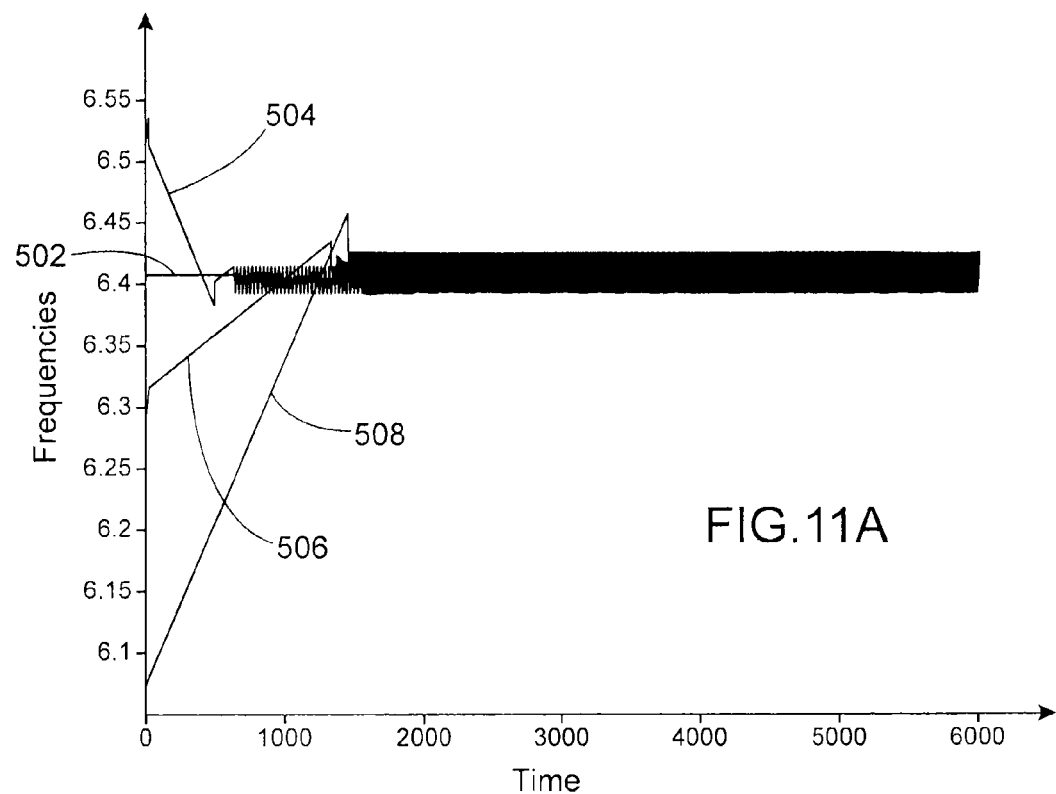
Figure 11B:
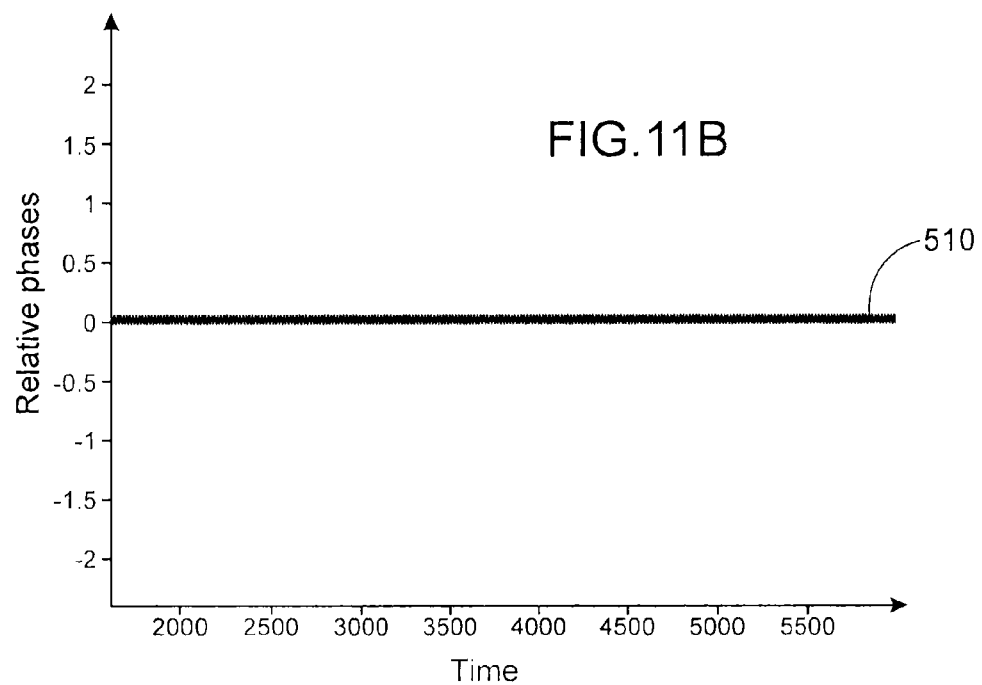
Figure 11C:
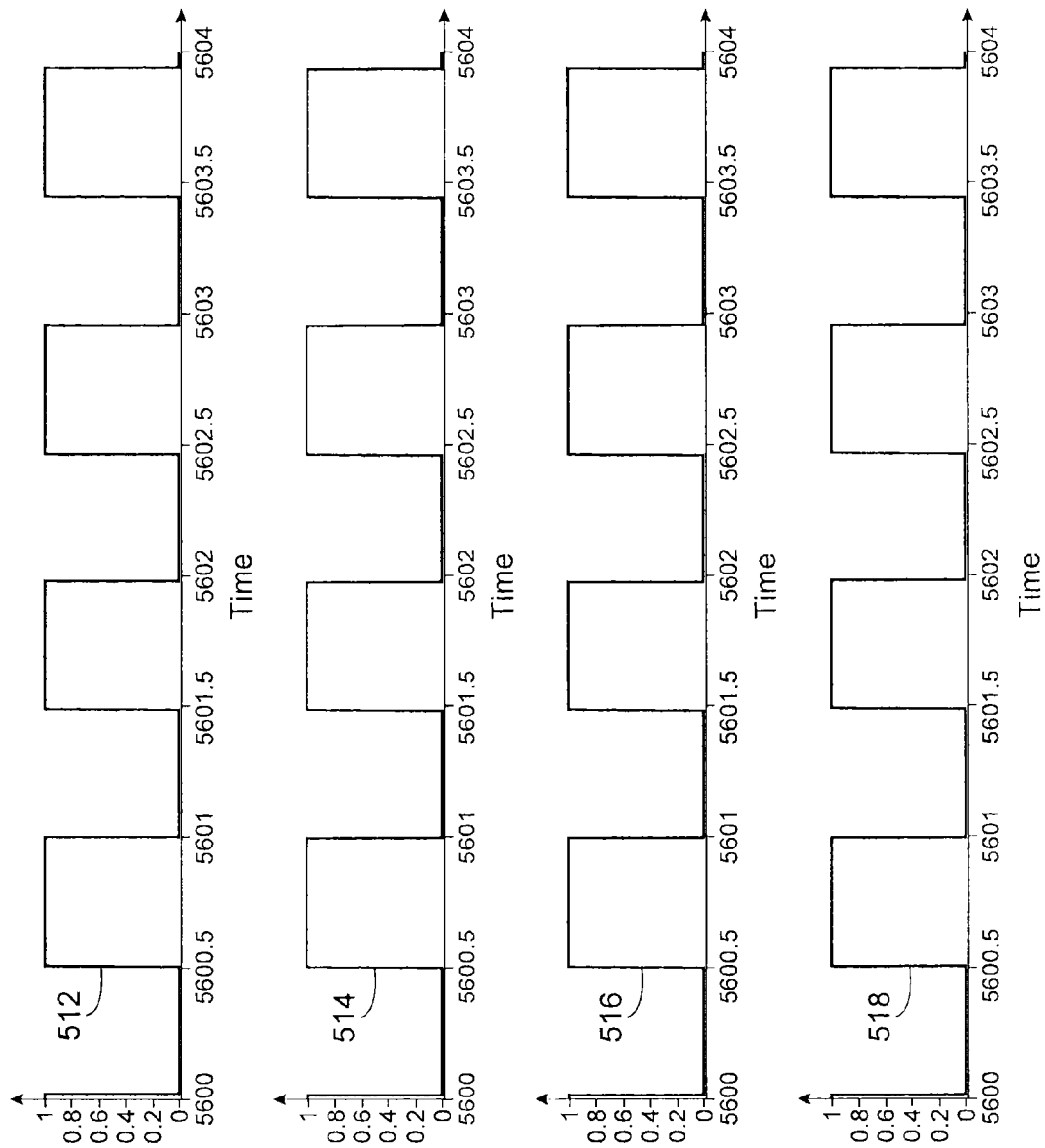
Figure 12:
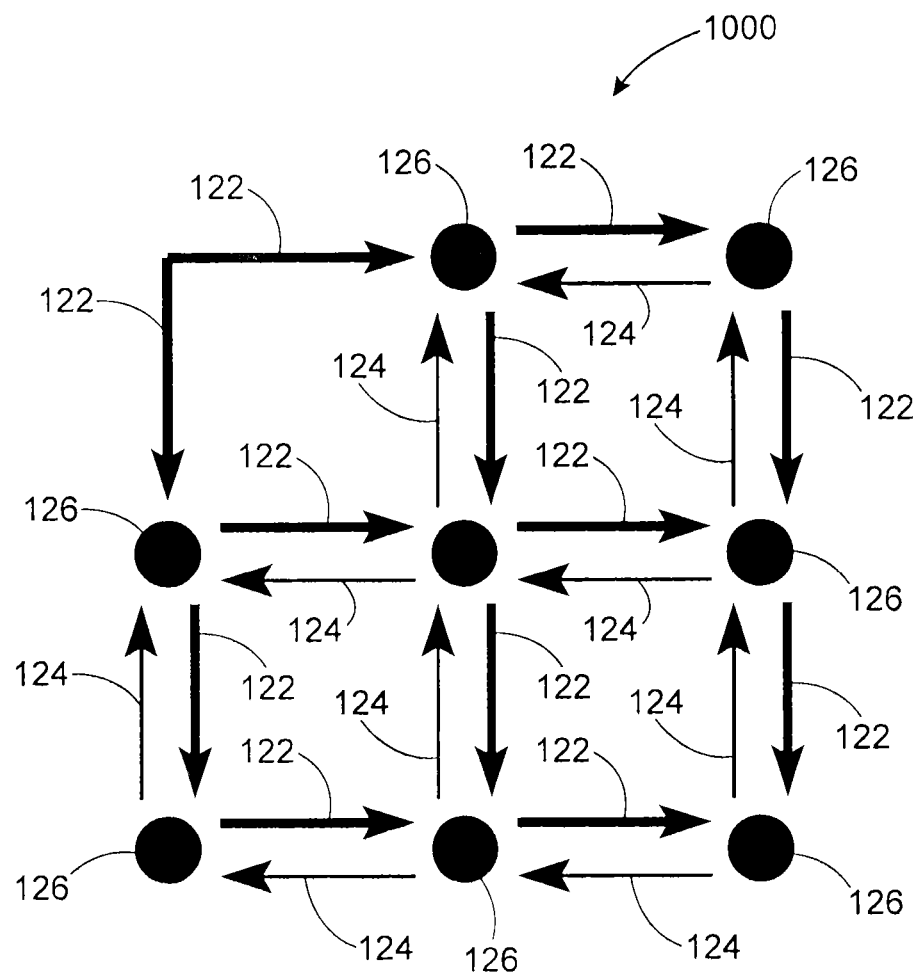

The present invention will be better understood on reading the description of example embodiments given purely as an indication and in no way restrictively, making reference to the appended illustrations in which:

FIG. 1 represents a distributed network of interconnected PLLs generating clock signals, FIG. 2 represents a distributed network of four interconnected PLL nodes generating clock signals, FIG. 3 represents schematically a device for generating clock signals, object of the present invention, according to a particular embodiment, FIG. 4 represents the diagram of a PLL of a device for generating clock signals, object of the present invention, according to a particular embodiment, FIG. 5 represents the response of a phase comparator of the bang-bang type of a PLL of a device for generating clock signals, object of the present invention, FIG. 6 represents an example embodiment of a phase comparator of the bang-bang type of a PLL of a device for generating clock signals, object of the present invention, FIG. 7 represents an example embodiment of a PLL of a device for generating clock signals, object of the present invention, FIG. 8 represents the synchronisation of phases accomplished by the PLL represented in FIG. 7, FIG. 9 represents an example embodiment of a PLL not making an asymmetrical comparison of the phase errors applied at the input of the PLL, FIG. 10 represents the dynamic properties of the PLL of FIG. 9 without the phase synchronisation, FIGS. 11A, 11B and 11C represent results of simulations of three PLLs of a device for generating clock signals, object of the present invention, and of an external reference signal, FIG. 12 represents a part of a device for generating clock signals, object of the present invention, according to a particular embodiment, in which the clock signals are propagated in the distributed network of phase-locked loops, without forming a closed loop.

Identical, similar or equivalent portions of the various figures described below have the same numerical references, to make it easier to move from one figure to another.

The various parts represented in the figures are not necessarily represented at a uniform scale, in order to make the figures more readable.

The various possibilities (variants and embodiments) must be understood as not being mutually exclusive, and being able to be combined with one another.

DETAILED ACCOUNT OF PARTICULAR EMBODIMENTS

Reference will firstly be made to FIG. 3, which represents a device 1000 for generating clock signals according to a particular embodiment. In a comparable manner to distributed network 10 represented in FIG. 1, device 1000 forms a distributed network of phase-locked loops, or PLLs, which are interconnected and synchronised with one another. In this case this network takes the form of a two-dimensional grid. Each of the PLLs is formed by a node 103 of the grid, consisting of a controlled oscillator, of means of weighted summation and of filtering means which will be described in greater detail below in connection with PLL 100 represented in FIG. 4. Each of the PLLs is also formed of phase comparators 102 positioned between each node 103. Each of these phase comparators 102 is used to form two PLLs from two nodes 103 adjacent to each of phase comparators 102. Such a device 1000 enables a clock signal to be generated in each node 103, which is synchronised with the other clock signals delivered to the other nodes 103. In this particular embodiment at least one of nodes 103 of device 1000 does not form a PLL, but is used to generate a reference clock signal with which the PLLs of device 1000 will be synchronised in terms of frequency and phase. For example, in the example of FIG. 3, it is the node referenced 105 which includes such a generator, forming a master clock of device 1000. However, in a variant of this embodiment, it is possible that all nodes 103 of device 1000 form PLLs, and device 1000 then does not use a master clock to synchronise the network of PLLs. In this variant, the oscillators of device 1000 are synchronised in terms of frequency and phase with one another, without an external clock, and the frequency obtained can correspond to an averaged frequency, the value of which depends on the chosen coefficients, of a signal which can be interpreted as an averaged virtual master signal.

It can be seen in FIG. 3 that the PLLs are mutually interconnected in bidirectional fashion, and form several closed loops of PLLs.

Reference will now be made to FIG. 4, which represents a PLL 100 of device for generating clock signals 1000. This PLL 100 includes an oscillator 101, in this case a DCO (digital controlled oscillator), i.e. a VCO (voltage-controlled oscillator) able to receive a digital control signal on 1 or more bits. PLL 100 also includes several phase comparators, in this case four phase comparators 102.1-102.4, where each of these phase comparators is able to make a comparison between the phase of the clock signal delivered by the local oscillator, i.e. oscillator 101, and the phase of a clock signal delivered by one of the control oscillators of one of the adjacent nodes.

The number of phase comparators included in each PLL depends on its position in device 1000. Thus, the PLL may include two phase comparators 102 when node 103 of the PLL is positioned in a corner of device 1000 taking the form of a grid. The PLL may include three phase comparators 102 when node 103 of the PLL is positioned on the edge of device 1000 taking the form of a grid. Finally, the PLL may include four phase comparators when the PLL is positioned within device 1000, i.e. between the edges of the grid. In a variant, it is also possible that each PLL includes more than four phase comparators, for example when the device for generating clock signals is not produced in the form of a two-dimensional grid, but for example in the form of a three-dimensional pattern, or in the form of a two-dimensional grid including connections aligned in more than two Cartesian directions, forming, for example, a star.

In the example of FIG. 4, PLL 100 includes four phase comparators 102.1-102.4.

Each of phase comparators 102.1-102.4 includes a first input 104.1-104.4 connected to an output 106 of controlled oscillator 101 of PLL 100. In addition, each of phase comparators 102.1-102.4 includes a second input 108.1-108.4 each of which is connected to an output of the controlled oscillator of each of the adjacent PLLs of PLL 100.

Each phase error calculated by phase comparators 102.1-102.4 is then summed in weighted summation means 110, forming a weighted adder, which accomplishes a weighted sum of these phase errors. In addition, although this is not represented in FIG. 4, the outputs of each of phase comparators 102.1-102.4 are also sent to the respective inputs of the weighted summation means of the adjacent PLLs (a reversal of the phase errors' sign having been previously accomplished before they are input into these weighted summation means). The weighted sum obtained at the output of means 110 is then sent into a low-pass filter 112 which at output provides a control regulating the frequency of local controlled oscillator 101. Output 106 of controlled oscillator 101 forms the output of PLL 100 to which is delivered the clock signal used to correct the clock signals of the other adjacent PLLs of device 1000.

Weighted summation means 110 are, in this case, such that one of the weighting coefficients applied to one of the output signals of phase comparators 102.1-102.4, for example that of phase comparator 102.1, has an absolute value, called $n_j$, higher than the sum of the absolute values of the other weighting coefficients, called $n_i$, where $i \neq j$, applied to the other output signals of phase comparators 102.1-102.4, such that:

$$n_j > \sum_{i \neq j} n_i$$

In a variant embodiment it is possible that the weighted sum is accomplished to give a greater weight to several of the clock signals applied at the inputs of PLL 100. In this case the weighting coefficients are chosen such that the sum of the absolute values of the weighting coefficients applied to a part of the output signals of phase comparators 102.1-102.4, called heavy coefficients, is greater than the sum of the absolute values of the other weighting coefficients, called light coefficients, applied to the other output signals of phase comparators 102.1-102.4. These heavy coefficients then compensate for the light coefficients.

In this variant embodiment the weighting coefficients are chosen such that the clock signals, delivered at the outputs of the adjacent phase-locked loops, and the phases of which, compared to the phase of the clock signal delivered by the controlled oscillator, correspond to said output signals to which are applied the weighting coefficients, the sum of the absolute values of which is greater than the sum of the absolute values of the other weighting coefficients, are propagated in the distributed network of phase-locked loops without forming a closed loop. An example of such a configuration is represented in FIG. 12. In this figure only a portion of device 1000 is represented. Arrows 122 represent the clock signals the phases of which compared with the phase of the clock signal delivered by the controlled oscillator correspond to said output signals to which the heavy coefficients are applied, whereas arrows 124 represent the clock signals the phases of which compared to the phase of the clock signal delivered by the controlled oscillator correspond to the output signals to which the light weighting coefficients are applied. These clock signals are propagated through the PLLs, referenced 126, of device 1000. It can be seen in FIG. 12 that the clock signals corresponding to arrows 122 are propagated in PLL network 126 without forming a closed loop, i.e. they do not return to a PLL from which they have been output. The propagation paths defined by these heavy coefficients do not form a closed loop.

In another variant, it is possible that arrows 122 represent the clock signals the phases of which compared to the phase of the clock signal delivered by the controlled oscillator correspond to the output signals to which the light coefficients are applied, whereas arrows 124 represent the clock signals the phases of which compared to the phase of the clock signal delivered by the controlled oscillator correspond to the output signals to which the heavy weighting coefficients are applied. In this case also, the propagation paths defined by these heavy coefficients do not form a closed loop. Other configurations are also possible.

According to this variant embodiment, in each phase-locked loop of device 1000, if the absolute values of the heavy coefficients are designated $n_j$, and the absolute values of the light coefficients are designated $n_i$, this gives:

$$\sum n_j > \sum_{i \neq j} n_i$$

Phase comparators 102.1-102.4 are in this case of the bang-bang type. Each of these phase comparators 102.1-102.4 generates at output a signal on 1 bit representing the sign of the phase shift between the clock signals applied to the two inputs 104.1-104.4 and 108.1-108.4 of these phase comparators 102.1-102.4, i.e. between a reference clock signal originating from one of the adjacent PLLs, and the clock signal originating from local controlled oscillator 101 of PLL 100. The response of a phase comparator of the bang-bang type is represented in FIG. 5. Each of phase comparators 102.1-102.4 outputs a signal equal to +1 or to −1 when the reference clock signal (originating from an adjacent PLL) is respectively in advance of or behind the local clock signal (originating from output 106 of local controlled oscillator 101). Given that the output signals of phase comparators 102.1-102.4 are encoded on 1 bit, these signals can easily be weighted with appropriate coefficients applied by means 110, enabling an automatic change of operating mode of PLL 100 to be accomplished, as explained above. In addition, in this example embodiment, the elements of PLL 100, i.e. phase comparators 102.1-102.4, means of weighted summation 110, filter 112 and controlled oscillator 101, are of the digital type, thus forming a digital PLL 100.

An example of a diagram of the construction of a phase comparator 102 of the bang-bang type is represented in FIG. 6. This phase comparator 102 includes a first input 104 to which is applied the clock signal of the local oscillator and a second input 108 to which the reference clock signal (originating from an adjacent PLL) is applied. Each of these two clock signals are sent to the input of one of two flip-flops D 114, enabling the arrival of a front in the clock signals applied to inputs 104 and 108 to be detected. Phase comparator 102 also includes a mutual exclusion element 116 enabling it to be determined which of the two fronts of the clock signals has arrived first, disregarding the situation of metastability (the case in which two clocks arrive simultaneously or almost simultaneously), thus making a comparison of the phases of both clock signals. The result of this comparison is stored in a flip-flop R-S 118 the output of which forms the output of phase detector 102. An element of the C Muller type 120 allows, with appropriate logical elements, flip-flops 114 to be reset in order that they are able to detect new clock signal fronts. Other details concerning such a phase comparator are described in the document "A Wide Power Supply Range, Wide Tuning Range, All Static CMOS All Digital PLL in 65 nm SOI" by J. A. Tierno et al., IEEE Journal of Solid-State Circuits, vol. 43, No. 1, January 2008.

In a variant embodiment, it is possible that the PLLs of device 100 may include phase comparators delivering output signals on several bits. Indeed, when device 1000 is operating in a steady state, phase comparators of the bang-bang type can cause oscillations. And, bearing in mind the nature of this type of 1-bit comparator, with phase errors close to zero (i.e. when device 1000 is in a synchronised state), the outputs of bang-bang phase comparators can oscillate between +1 and −1 randomly with an average equal to zero. These oscillations, the values of which are a function of the chosen filter, can cause more or less substantial amplitude oscillations of the frequency of the signal originating from the local oscillator and, consequently, affect the PLL's synchronisation accuracy.

A first solution may consist in reducing the static gain of the filter used in the PLLs, in order to reduce these frequential oscillations of the signal delivered by the local oscillator. This first solution has, however, the disadvantage that it reduces the speed of convergence of the PLL in a synchronised state, thus increasing the synchronisation time required by device 1000.

Another solution may consist in using phase comparators delivering an output signal on several bits, supplying a phase error encoded on n bits, where n is an integer strictly greater than 1. Thus, notably in the case of substantial phase errors, the output of the phase comparators may have a high value, forcing rapid convergence of device 1000 towards synchronisation, whereas in the case of small phase errors, when device 1000 is in a steady state, the output of the phase comparators still oscillates, but with a smaller relative oscillation, reducing its impact on the PLL's oscillation frequency, and therefore on its accuracy. Such phase comparators can deliver at their output a signal which may or may not be symmetrical around 0. The documents "Design and VHDL Modeling of All-Digital PLLs" by E. Zianbetov et al., 8th IEEE International NEWCAS Conference (NEWCAS'10), Montreal, Canada, 20-23 Jun. 2010, and "A high-resolution Flash time-to-digital converter and calibration scheme" by P. M. Levine et al., Test Conference, 2004. Proceedings. ITC 2004. International, 26-28 Oct. 2004, pages 1148-1157, describe the elements allowing construction of a phase comparator on n bits.

When the PLLs include such phase comparators on n bits, and when it is desired that, in each PLL, one of the clock signals received at the inputs should be predominant over the others, the absolute value weighting coefficient $n_j$ applied for the predominant clock signal is then chosen such that:

$$n_j > \frac{K}{k} \sum_{i \neq j} n_i$$

where K: maximum value of the absolute value of the output of the phase comparator;

k: minimum value of the absolute value of the output of the phase comparator.

By this means an automatic change of the mode of propagation of the phase information in device 1000 is guaranteed.

When the PLLs include phase comparators on n bits, and it is desired that, in each PLL, the weighted sum should enable a higher weight to be given to several of the clock signals applied at the inputs of a PLL, the weighting coefficients are chosen such that:

$$\sum n_j > \frac{K}{k} \sum_{i \neq j} n_i$$

Where $n_j$: absolute values of the heavy coefficients;

$n_i$: absolute values of the light coefficients.

The operation is now described, in connection with FIG. 7, of a PLL 200 including, in a manner comparable to PLL 100, a controlled oscillator 201, phase comparators 202.1 and 202.2, means of weighted summation formed by an adder 210 and amplifiers 214 and 216 of different gains, and also a low-pass filter 212. This PLL 200 includes only two phase comparators 202.1 and 202.2 since it is positioned, in device 1000, in one of the corners of the network, and is therefore connected only to two other adjacent PLLs. The weighting of the phase errors obtained at the output of phase comparators 202.1 and 202.2 is accomplished by a first amplifier 214 of gain equal to 2 and by a second multiplier 216 of unit gain. Adder 210 therefore adds the weighted phase errors obtained at the output of amplifiers 214 and 216.

Bearing in mind the different gains of amplifiers 214 and 216, an asymmetrical comparison is therefore made of the phase errors delivered by phase comparators 202.1 and 202.2. In the example of FIG. 7, bearing in mind the gain equal to 2 of amplifier 214 compared to the unit gain of amplifier 216, greater importance is therefore accorded to the phase error delivered by phase comparator 202.1. If PLL 200 had more than two phase comparators, for example three or four, it would be possible to accord greater importance to the phase error delivered by one or more phase comparators by giving them amplifiers of gains higher than the sum of the gains of the other amplifiers receiving at input the comparison signal of the other phase comparators, where this sum of the gains of the other amplifiers receiving at input the signal of comparison of the other phase comparators can be multiplied by factor K/k as in the previous examples.

The phase correction accomplished by this PLL 200 is illustrated by the lines and curve represented in FIG. 8. Straight line 302 represents the phase of one of the two adjacent PLLs applied at the input of phase comparator 202.1 and straight line 304 represents the phase of the other of the two adjacent PLLs applied at the input of phase comparator 202.2. Curve 306 represents the phase of the output signal of local oscillator 201. During a first period 308, the phase errors detected by both phase comparators 202.1 and 202.2 are negative. A correction signal equal to −3 is therefore applied at the input of low-pass filter 212 during this first period 308, causing a reduction of the frequency of local oscillator 201. When the phase of the output signal of local oscillator 201 is once again between the phases of the two adjacent PLLs (period referenced 310 in FIG. 7, in which curve 306 is between straight lines 302 and 304), PLL 200 then changes its operating state. Indeed, given that the signal at the output of phase comparator 202.1 is no longer equal to +1 but to −1, the correction signal then becomes equal to +1, which is equivalent to considering only the phase error originating from phase comparator 202.1. The frequency of local oscillator 201 then increases. The phase information propagation state becomes unidirectional (without closed loops), enabling PLL 200 to be prevented from being put into a parasitic mode. In addition, it can be seen that this change of state occurs automatically. The phase of local controlled oscillator 201 will follow the one represented by straight line 302.

By comparison, in the case of a PLL 400 (represented in FIG. 9) not making an asymmetrical comparison of the phase errors and which includes the same elements as PLL 200 except for amplifiers 214 and 216, straight lines 302 and 304 similar to those of FIG. 8 are represented in FIG. 10, together with a curve 312 representing the phase of the output signal of local oscillator 201 of PLL 400. During first period 308, when the phase of the output signal of local oscillator 201 of PLL 400 is higher than the phase errors of the two adjacent PLLs, the correction signal applied at the input of low-pass filter 212 is equal to −2, causing a reduction of the frequency of local oscillator 201 of PLL 400. When the phase of the output signal of local oscillator 201 of PLL 400 passes between the phases of the two adjacent PLLs, the correction coefficient then becomes equal to 0. Thus, the phase no longer changes, and continues to increase with the nominal frequency of oscillator 201 of PLL 400. It can therefore be seen that PLL 400 is blocked in a parasitical mode and that the phase errors are no longer corrected.

Reference is now made to FIGS. 11A, 11B and 11C, which represent results of simulation of three PLLs of device 1000.

Curves 504, 506 and 508 represented in FIG. 11A correspond to the clock signal frequencies obtained at the output of three PLLs of device 1000. Straight line 502 represents the reference clock signal applied to node 105 of device 1000. It can be seen in this FIG. 11A that the three curves 504, 506 and 508 rapidly converge on line 502. It can also be observed that after having reached the value of straight line 302, these three curves oscillate around the value of straight line 302. These oscillations are due to the nature of the phase comparators of the bang-bang type operating in a synchronised state of the PLLs of device 1000. It is possible to reduce or even eliminate these oscillations by designing device 1000 such that it is possible to modify the values of the weighting coefficients applied to the various phase comparisons made by the PLLs of device 1000. It is, for example, possible to design PLLs including variable gain amplifiers, the values of which would be chosen according to the state of device 1000 (stable or unstable state). It is also possible to use the phase comparators making an asymmetrical comparison, i.e. a comparison with a linear response when the result of the comparison is close to zero and a "bang-bang" comparison when the result of the comparison is not close to zero.

In FIG. 11B, the values of the relative phases of the clock signals obtained at the output of the three PLLs of device 1000 when device 1000 has reached its stable state are plotted. It can be seen in this FIG. 11B that the values of the phases of the clock signals of these three PLLs are roughly constant and form a straight line 510 of a value roughly equal to 0. It can therefore be seen that the three PLLs have no phase error relative to the master clock signal of device 1000.

Finally, in FIG. 11C, master clock signal 512 has been represented together with clock signals 514, 516 and 518 obtained at the output of the three PLLs when device 1000 has reached its stable state. It can be seen clearly in this figure that the clock signals obtained at the output of the three PLLs are perfectly synchronised with the master clock signal, in terms both of phase and of frequency.

The invention claimed is:

1. A device for generating at least one clock signal, comprising:
   a distributed network of phase-locked loops which are interconnected and synchronised with one another, wherein each phase-locked loop comprises:
   a controlled oscillator capable of delivering the clock signal at an output;
   a plurality of phase comparators capable of comparing a phase of the clock signal delivered by the controlled oscillator with a plurality of clock signal phases delivered at outputs of the adjacent phase-locked loops, and applied at inputs of the phase-locked loop;
   means for weighted summation of output signals of the plurality of phase comparators such that one of the weighting coefficients applied to one of the output signals has an absolute value higher than the sum of the absolute values of other weighting coefficients applied to other output signals and/or such that the sum of the absolute values of the weighting coefficients applied to a part of the output signals is greater than the sum of the absolute values of the other weighting coefficients applied to the other output signals; and
   means for filtering the weighted sum of the output signals of the plurality of phase comparators, and configured to deliver at an output a control signal to the controlled oscillator, and in which, when the sum of the absolute values of the weighting coefficients applied to a part of the output signals is greater than the sum of the absolute values of the other weighting coefficients applied to the other output signals, the clock signals, delivered at the outputs of the adjacent phase-locked loops, and the phases of which compared to the phase of the clock signal delivered by the controlled oscillator correspond to the output signals to which are applied the weighting coefficients, the sum of the absolute values of which is greater than the sum of the absolute values of the other weighting coefficients, are propagated in the distributed network of phase-locked loops without forming a closed loop.

2. The device according to claim 1, wherein each phase-locked loop includes two, three, or four phase comparators configured to compare a phase of the clock signal delivered by the controlled oscillator with the phases of the clock signals applied at the input of the phase-locked loop.

3. The device according to claim 1, in which each phase comparator is configured to deliver at an output a signal encoded on 1 bit representing a comparison sign which is to be made by the phase comparator between the phase of the clock signal delivered by the controlled oscillator and the phase of one of the clock signals applied at the input of the phase-locked loop.

4. The device according to claim 1, in which each phase comparator is configured to deliver at an output a signal encoded on plural bits representing a sign and absolute value of the comparison which is to be made by the phase comparator between the phase of the clock signal delivered by the controlled oscillator and the phase of one of the clock signals applied at the input of the phase-locked loop.

5. The device according to claim 4, in which the absolute value $n_j$ of the one of the weighting coefficients applied to one of the output signals which is greater than the sum of the absolute values $n_i$ of the other weighting coefficients applied to the other output signals is such that:

$$n_j > \frac{K}{k}\sum_{i \neq j} n_i,$$

wherein
   K: maximum value of the absolute value of the output of one of the phase comparators;
   k: minimum value of the absolute value of the output of one of the phase comparators.

6. The device according to claim 4, in which, when the sum of the absolute values $n_j$ of the weighting coefficients applied to a part of the output signals is greater than the sum of the absolute values $n_i$ of the other weighting coefficients applied to the other output signals, the absolute values $n_j$ are such that:

$$\sum n_j > \frac{K}{k}\sum_{i \neq j} n_i,$$

wherein
   K: maximum value of the absolute value of the output of one of the phase comparators;
   k: minimum value of the absolute value of the output of one of the phase comparators.

7. The device according to claim 1, in which the filtering means includes at least one low-pass filter.

8. The device according to claim 1, in which each of the weighting coefficients of the means for weighted summation has a value of between at least −4 and 4.

9. The device according to claim 1, in which at least one of the controlled oscillator, the phase comparators, the means for weighted summation, and the filtering means is of digital type.

10. The device according to claim 1, in which the phase-locked loops are connected to one another in a form of a grid.

11. The device according to claim 10, further comprising at least one generator of a reference clock signal applied at the input of at least one of the plurality of phase-locked loops.

12. An electronic device comprising a plurality of electronic elements synchronised by synchronous clock signals delivered by the phase-locked loops of a device according to claim 1.

* * * * *